US006653872B2

(12) United States Patent
MacGugan

(10) Patent No.: US 6,653,872 B2

(45) Date of Patent: Nov. 25, 2003

(54) MULTI-CHANNEL PRECISION SYNCHRONOUS VOLTAGE-TO-FREQUENCY CONVERTER

(75) Inventor: Douglas C. MacGugan, Bellevue, WA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 09/941,322

(22) Filed: Aug. 28, 2001

(65) Prior Publication Data

US 2002/0027454 A1 Mar. 7, 2002

Related U.S. Application Data

(60) Provisional application No. 60/229,938, filed on Sep. 1, 2000.

(51) Int. Cl.[7] .................................................. H03C 3/06

(52) U.S. Cl. ........................ 327/101; 327/105; 327/113

(58) Field of Search ................................ 327/101, 100, 327/50, 56, 131, 105, 137, 135, 140, 113; 341/157

(56) References Cited

U.S. PATENT DOCUMENTS 4,031,532 A * 6/1977 First ........................... 341/157
4,408,169 A 10/1983 Fraser ......................... 331/65
4,651,027 A 3/1987 Herzl ......................... 327/114
4,720,841 A 1/1988 Hooper ........................ 377/20
4,775,841 A * 10/1988 Trofimenkoff et al. ...... 327/101
RE34,899 E * 4/1995 Gessaman et al. .......... 341/157
5,495,193 A * 2/1996 Nukui ........................ 327/101
5,585,748 A * 12/1996 Yamaguchi et al. ........ 327/101
5,877,637 A * 3/1999 Trofimenkoff et al. ...... 327/101
5,917,346 A * 6/1999 Gord .......................... 327/101
6,137,336 A * 10/2000 Baba et al. ................. 327/295
6,233,205 B1 * 5/2001 Wells et al. ................ 368/118

* cited by examiner

*Primary Examiner*—Timothy P. Callahan
*Assistant Examiner*—Hai L. Nguyen
(74) *Attorney, Agent, or Firm*—Charles J. Rupnick

(57) ABSTRACT

A multi-channel synchronous voltage-to-frequency converter (SVFC) realized in an integrated semiconductor circuit. The multi-channel SVFC having an operational amplifier adapted to receive an analog data signal to be converted and a reset signal, the operational amplifier integrating the sum of the analog signal and the reset signal and generating an output signal as a function of the integrated sum; a comparator coupled to receive the integrated sum and a reference level signal, the comparator outputting a logic level signal as a function of the received reference level signal; a digital logic circuit in response to an external clock signal, the digital logic circuit receiving the logic level signal and generating a reset control signal and a frequency output pulse as a function of the logic level signal; and a reset source switch receiving the reset control signal and outputting the reset signal.

17 Claims, 2 Drawing Sheets

10
FREQOUT
+V
34
BUFFER
26
LOGIC CIRCUIT
32
XCLK
YCLK
ZCLK
TCLK
24
VREF (OPTIONAL)
VOUT
22
30
RESET
20
L
H
16
TO TEST
Q1
Q2
VTEST
SLFTEST
36
18
12
28
CLOCK

MULTI-CHANNEL PRECISION SYNCHRONOUS VOLTAGE-TO-FREQUENCY CONVERTER

This application claims the benefit of U.S. Provisional Application Serial No. 60/249,938, filed in the name of Douglas C. MacGugan on Sep. 1, 2000, the complete disclosure of which is incorporated herein by reference.

FIELD OF THE INVENTION

The present invention relates generally to voltage-to-frequency converters, and in particular to a methods and apparatuses for providing multi-channel capability in a synchronous voltage-to-frequency converter realized in an integrated circuit.

BACKGROUND OF THE INVENTION

Several types of precision sensor systems are known that provide an analog signal output. In order to provide useful information to modem digital systems, the analog signal output of these precision sensors must be translated to digital format. Furthermore, many applications require the translation from analog to digital to be accomplished without loss of data during the conversion sequence. Typical applications requiring a "no-loss" conversion include, but are not limited to, Inertial Guidance and Navigation systems, Inertial Pointing Systems, and steering and attitude determination systems. Common successive approximation (SA) analog-to-digital converters (ADC) operate using a "hold" time, which is not compatible with such a no-loss conversion.

Analog to digital conversion without loss of signal during conversion also accommodates digital filtering techniques, such as averaging over multiple samples, wherein quantization errors are reduced much faster, i.e., by 1/N rather than $1/\sqrt{N}$, where: N is the number of samples used in averaging.

Voltage-To-Frequency Converters (VFC's) are a form of ADC that provide no-loss conversion. Different VFC's use different approaches to convert the analog signal directly into a frequency proportional to the signal. This frequency is then counted by electronic counter means, usually in a processing or control system, to complete the digital output.

A synchronous VFC or SVFC is a form of VFC that is available for precision systems. Typically, the SVFC utilizes an external clock to synchronize the frequency output. The SVFC is more precise than the VFC because the counting method of the frequency is synchronized to the input clock of the VFC, which eliminates any errors on the counted digital output due to clock aging or other clock error effects. Any clocking error that does occur is a common mode error between the VFC and the counting electronics. This type of error is normally eliminated in the conversion process. Unfortunately, most available SVFC devices available have limited capability such that they can only handle one channel of analog conversion. Additionally, the available SVFC integrated devices typically consume large amount of power relative to the power consumption desired of a semiconductor circuit.

SUMMARY OF THE INVENTION

The present invention provides a synchronous voltage-to-frequency converter that overcomes the limitations of the prior art by providing a multi-channel capability in a synchronous voltage-to-frequency converter realized in an integrated semiconductor circuit that minimizes power consumption.

According to one aspect of the invention, the multi-channel synchronous voltage-to-frequency converter includes an integrator operational amplifier adapted to receive both an analog data signal to be converted and a reset signal, the integrator operational amplifier being structured to integrate the sum of the analog signal and the reset signal and to generate an output signal as a function of the integrated sum; a comparator coupled to receive the output signal of the integrator and a reference level signal, the comparator being structured to output a logic level signal as a function of the received reference level signal; a digital logic circuit responsive to an external clock signal, the digital logic circuit coupled to receive the logic level signal and being structured to generate a reset control signal and a frequency output pulse as a function of the logic level signal; and a reset source switch coupled to receive the reset control signal and being structured to output the reset signal as a function of the reset control signal.

According to another aspect of the invention, the multi-channel synchronous voltage-to-frequency converter may also include a trimming circuit coupled to an input of the integrator that is adapted to receive both an analog data signal to be converted and a reference voltage for trimming the analog data signal.

According to another aspect of the invention, the multi-channel synchronous voltage-to-frequency converter may also include a clock phasing circuit adapted to receive the external clock signal and to output the clock signal controlling the digital logic circuit, the clock phasing circuit being structured to phase a plurality of frequency output pulses generated by the digital logic circuit as a function of the number of channels of the multi-channel SVFC circuit. The clock phasing circuit may be a digital divider and phase shifter circuit.

According to another aspect of the invention, the multi-channel synchronous voltage-to-frequency converter may also include a self-test circuit coupled to an input to a summing junction of the operational amplifier between the summing junction and analog data signal to be converted. The self-test circuit may be implemented as a MOSFET switch structured to present an essentially zero impedance path for the analog data signal to be converted.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is a multi-channel synchronous voltage-to-frequency converter having phased output pulses and an input self-test feature.

The present invention also provides a method of converting an analog signal to a digital signal without loss.

Figure 1:
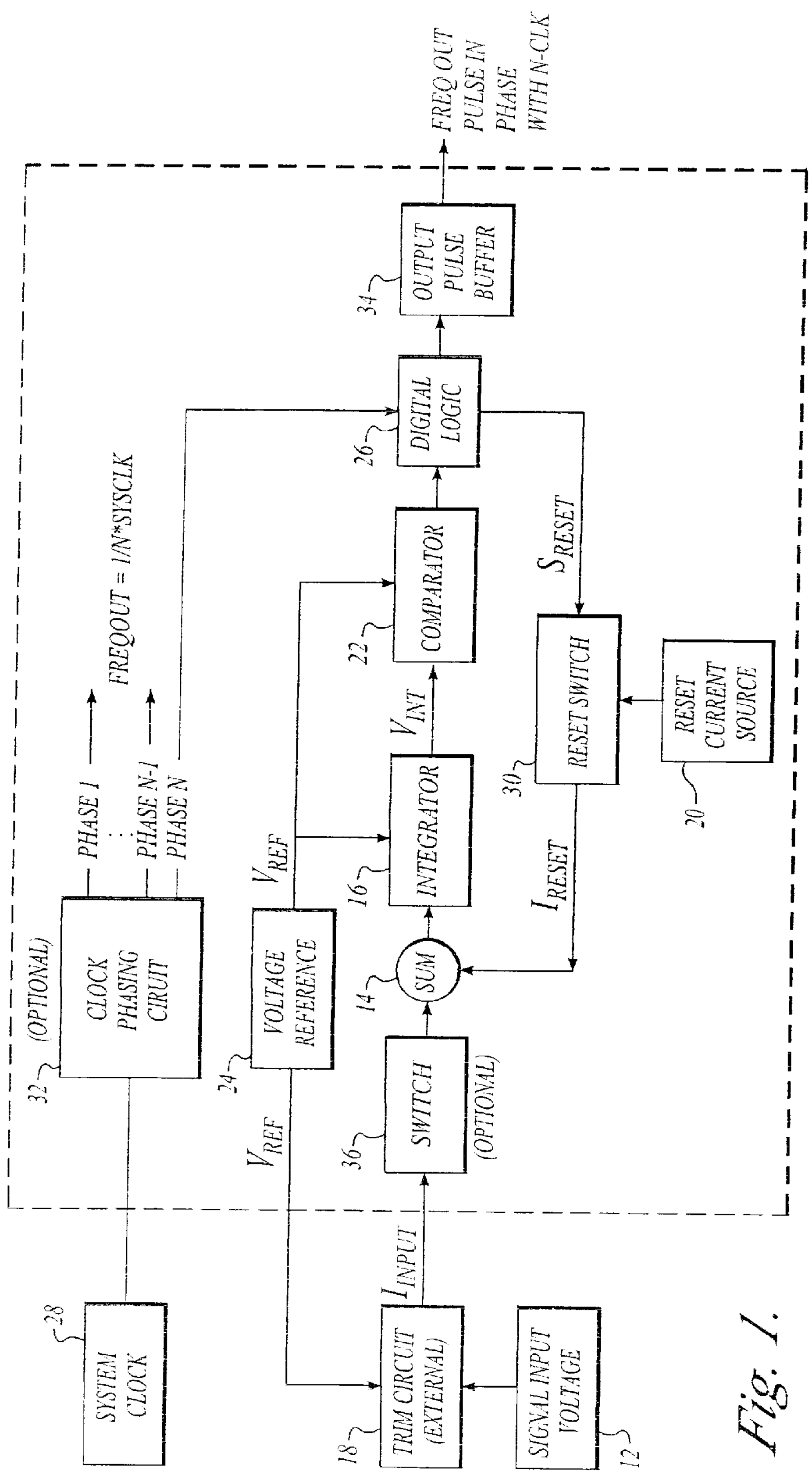
FIG. 1 shows the invention embodied as a multi-channel synchronous voltage-to-frequency converter having phased output pulses and an input self-test feature.

FIG. 1 is a functional block diagram showing the invention embodied as a multi-channel SVFC (synchronous voltage-to-frequency converter) circuit 10, including optional phased output pulses and an optional input self-test feature. In FIG. 1, an input analog data signal 12 to be converted is applied to a summing junction 14 of an integrator operational-amplifier 16, commonly referred to as an "op-amp." The input analog signal 12 is passed through a trimming circuit 18, implemented as a scaling and bias offset resistor array, and applied to the integrator op-amp 16 as a current $I_{INPUT}$. A reset signal current $I_{RESET}$ from a reset current source 20 is also applied to the summing junction 14. In normal operation, the integrator will integrate the sum of the analog signal current $I_{INPUT}$ and the reset current $I_{RESET}$.

The output of the integrator op-amp 16 is a voltage $V_{INT}$ that is applied to a fast response comparator 22. The comparator 22 is set to trigger at a level established by a precision voltage reference generator 24 outputting a precision voltage reference $V_{REF}$. The precision voltage reference $V_{REF}$ establishes the trigger level for the comparator 22 and the non-inverting input reference of the input op-amp 16. The precision voltage reference $V_{REF}$ also provides the scaling and bias voltage of the trimming circuit 18. This method of using the same precision voltage reference $V_{REF}$ for all three circuits: the op-amp 16, the trimming circuit 18, and the comparator 22, makes the frequency output of the device immune to drift or changes in the precision voltage reference device 24.

The output of the comparator 22 is a logic level signal that is applied to a digital logic circuit 26 consisting mainly of flip-flop logic and clocked by an external clock 28. The output of the digital logic circuit 26 determines when the reset current $I_{RESET}$ is switched ON and applied to the summing junction 14 of the integrator op-amp 16. The output of the digital logic circuit 26 also generates the desired frequency output pulses of the multi-channel SVFC 10 circuit.

In normal operation, the input analog signal 12 causes a ramp in the output voltage $V_{INT}$ of the integrator op-amp 16. When this ramped integrator output voltage $V_{INT}$ crosses the reference voltage $V_{REF}$ applied to the comparator 22, the comparator 22 changes state. A reset switch signal $S_{RESET}$ is generated by the digital logic circuit 26 synchronous with a clock pulse from the external clock 28. The reset switch signal $S_{RESET}$ causes a reset switch 30 to apply the reset current $I_{RESET}$ to the integrator op-amp 16, which drives the ramped output voltage $V_{INT}$ of the integrator op-amp 16 in the opposite direction. The comparator 22 flips state again as the ramped integrator output voltage $V_{INT}$ crosses the reference voltage $V_{REF}$, and the cycle repeats.

By inspection, the input analog signal 12 is never absent from the integrator op-amp 16 during the entire conversion cycle. Therefore, in contrast to the conventional SA ADC devices, no information is lost from the signal.

An optional timing circuit 32 is provided on the input clocking signal from the external clock 28. The timing circuit 32 is a digital divider and phase shifter that phases the multi-channel frequency output pulses generated by the digital logic circuit 26 as a function of the number of channels, whereby the frequency output is equal to 1/n times the clock signal generated by the external system clock 28, where n is the number of channels in the multi-channel SVFC circuit 10.

The frequency output pulse on each channel only occurs out-of-phase with the frequency output pulses on other channels. The frequency output pulses are applied to a frequency output pulse buffer 34, which provides ordered frequency output pulses in phase with the phased clock signal 28. This method reduces switching noise within the integrated circuit embodying the multi-channel SVFC circuit 10 of the invention, reduces spurious power supply spiking due to current surges, and results in lower thermal operations.

An optional "self-test" feature is implemented in the multi-channel SVFC circuit 10 of the invention as a switch 36, such as a MOSFET switch, on the input to the integrator summing junction 14. In normal operation, the MOSFET switch 36 presents an essentially zero impedance path for the analog signal 12 being converted. However, in self-test mode, the MOSFET switch 36 is actuated to block the analog signal and provide a known reference current $I_{REF}$ to the integrator summing junction 14. The MOSFET switch 36 thereby drives the SVFC frequency to a known frequency. The MOSFET switch 36 is thus useful during system power up and reset, and for fault diagnostics. In an integrated circuit embodying the multi-channel SVFC circuit 10 of the invention, the MOSFET self-test feature is implemented through a digital logic switch input to the integrated circuit.

The combination of the clock phasing circuit 32 with output pulse buffer 34 and the single precision voltage reference generator 24 in combination with the single system clock 28 permit the SVFC circuit 10 of the invention to support multiple channels. This combination of the single precision voltage reference generator 24 with the single system clock 28 ensures that all the channels are matched in performance, which causes the ratio of signals to be highly stable. In other words, the ratio of X versus Y on channel n verses channel m is highly stable.

The common utilization of the system clock 28 and voltage reference generator 24 also significantly reduces errors due to component drift, aging and other changes.

Figure 2:
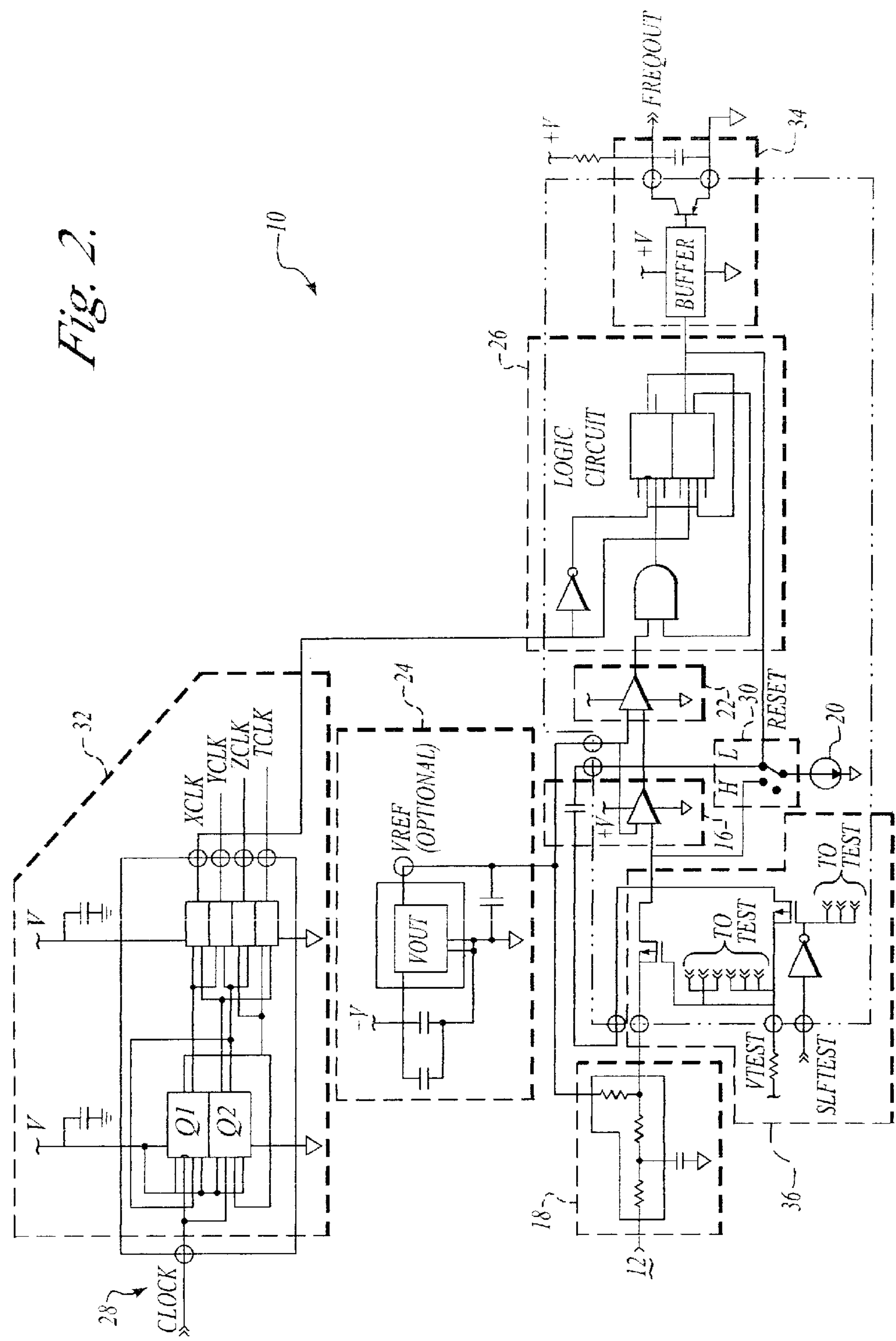
FIG. 2 shows a circuit that embodies the invention in a 4-phase implementation.

FIG. 2 shows one channel of the multi-channel SVFC circuit 10 of the invention embodied as an integrated circuit having at least 4 channels of a charge-reset, mixed-mode circuit. Each circuit includes the essential components of the multi-channel SVFC circuit 10 diagrammed in FIG. 1. The invention is not limited to the exemplary 4-channel circuit described in FIG. 2, but is applicable to multi-channel SVFC circuits in general, which are considered equivalents of the described circuit 10.

According to one embodiment of the invention, the multiple channels of the multi-channel SVFC circuit 10 are implemented in ASIC (application specific integrated circuit) format, whereby a system level approach to precision analog signal conversion without loss of data is obtained. Various novel aspects of the invention permit the multi-channel SVFC circuit 10 to be implemented in ASIC format, including phasing clocks to reduce integrated circuit noise, using the common voltage reference generator 24 to reduce errors, utilizing a digital approach to enhance performance through long-term stability, and utilizing known circuit design techniques to produce a circuit design conducive to CMOS implementation.

The multi-channel SVFC circuit 10 of the invention is thus implemented as multiple SVFC circuits in a high temperature silicon-on-insulator (SOI) CMOS architecture. The SOI CMOS architecture provides a system level SVFC conversion useful in multiple sensor systems. The SOI CMOS architecture also provides a low power CMOS solution in a high temperature (225° C.) compatible semiconductor. Utilizing a circuit design compatible with CMOS and SOI CMOS implementation results in the lower power consumption, which is aided by actual implementation in ASIC format.

The SOI CMOS architecture results in lower system level costs, and increased system level reliability through reduction of overall parts count. The SOI CMOS architecture also results in lower power requirements and a lower thermal signature. The advantatges of implementing the multiple SVFC circuits of the invention in a high temperature SOI CMOS architecture relate to an enhanced system level performance, versus an implementation using either discrete components or multiple single-channel SVFCs.

While the preferred embodiment of the invention has been illustrated and described, it will be appreciated that various changes can be made therein without departing from the spirit and scope of the invention.

The embodiments of the invention in which an exclusive property of privilege is claimed are defined as follows:

1. A multi-channel SVFC (synchronous voltage-to-frequency converter) circuit, comprising:

a switchable input stage configured to exclusively receive a clocking signal input from a single external clock and to selectively receive one of a plurality of analog data signals on a plurality of different channels in response to the clocking signal;

an integrator adapted to receive the analog data signal from the switchable input stage and a reset signal, the integrator being structured to integrate the analog signal and generate an output signal as a function of the integrated analog signal;

a comparator coupled to receive the output signal from the integrator and a reference level signal, the comparator being set to trigger as a function of the received reference level signal and being structured to output a logic level signal as a function of the received integrator output signal;

a digital logic circuit responsive to the clocking signal, the digital logic circuit coupled to receive the logic level signal and structured to generate the reset control signal and a frequency output pulse on each of the channels as a function of the logic level signal and in phase with the clocking signal;

a timing circuit coupled to receive the input clocking signal from the single external clock, the timing circuit being structured to phase each of the frequency output pulses generated by the digital logic circuit as a function of a quantity of the plurality of different channels; and a frequency output pulse buffer coupled to receive the frequency output pulse of each of the channels and being structured to generate ordered frequency output pulses in phase with the phased clocking signal.

2. The circuit of claim 1, wherein the integrator is an operational amplifier configured to receive the analog data signal from the switchable input stage and the reset signal.

3. The circuit of claim 1, wherein the switchable input stage further includes a trimming circuit coupled to an input of the integrator.

4. The circuit of claim 3, wherein the switchable input stage further includes selectively receiving a common reference level signal commonly received by each of the comparator, the non-inverting junction of the integrator, and the trimming circuit.

5. The circuit of claim 4 wherein the comparator is a fast response comparator set to trigger at the voltage reference level established by a voltage reference circuit.

6. The circuit of claim 1 wherein the switchable input stage includes a clock phasing circuit adapted to receive an external clock signal and output the clock signal controlling the digital logic circuit, the clock phasing circuit phasing a plurality of frequency output pulses generated by the digital logic circuit.

7. The circuit of claim 6 wherein the phasing the plurality of frequency output pulses generated by the digital logic circuit is a function of a desired number of output channels.

8. The circuit of claim 7 wherein the analog input signal includes a voltage reference signal.

9. The circuit of claim 1, further including a self-test circuit configured to generate a known input voltage to submit as an analog data signal to the integrator.

10. A method for-multi-channel synchronous voltage-to-frequency conversion comprising:

selecting an analog data signal from a plurality of analog data signals on a plurality of different channels based upon a receiving an external clocking signal;

integrating the analog data signal;

as a function of receiving a reference voltage, comparing the integrated analog data signal to the reference voltage;

changing state as a function of the reference voltage and outputting a state logic level signal;

as a function of the external clocking signal, generating a reset control signal and a plurality of frequency output pulses as a function of the state logic level signal;

phasing each of the frequency output pulses as a function of a quantity of the plurality of different channels; and generating ordered frequency output pulses in phase with the phased external clocking signal; and resetting the integrating as a function of the state logic level signal and in phase with the phased external clocking signal.

11. The method of claim 10 wherein the clock phasing is by means of digitally dividing and phase shifting in an electronic circuit.

12. The method of claim 10, further including self-testing by inputting a known voltage into the circuit.

13. A multiple input synchronous voltage-to-frequency converter, the converter comprising:

a switchable input output stage configured to receive a single external clock signal phased as a function of a plurality of input analog data signals and to select one of the plurality of analog data signals, and to select a corresponding one of a plurality of output buffers in response to the phased clock signal, each of the output buffers being structured to generate ordered frequency output pulses inphase with the phased clock signal, an integrator, the integrator being configured to receive an analog signal at a first summing junction and a voltage reference signal, having a voltage value at a second summing junction, the integrator being further configured to output an output signal having a voltage value representative of integrated sums of the analog signal and the voltage reference signal, the integrator being still further configured to terminate a first integration and begin a second integration in response to receiving a reset signal at a reset terminal;

a comparator, the comparator configured to compare the voltage value of the output signal to the voltage value of the voltage reference signal and to change logical states at a comparator output terminal in response to the voltage value of the output signal exceeding the voltage value of the voltage reference signal; and a logic section for generating a reset signal in response to the changed logical state at the comparator output terminal.

14. The converter of claim 13, wherein the logical section is further configured to store a frequency value in the buffer section.

15. The converter of claim 13, wherein the clock signal is phased by a clock phasing circuit, and wherein the number of phases corresponds to a number of the plurality of analog data signals.

16. The converter of claim 13, wherein the phased clock signal is generated by a digital divider and phase shifter circuit.

17. The converter of claim 13, wherein the phased clock signal is connected with the logical section such that the reset signals are in phase with the phase clock signal.

* * * * *